(12) United States Patent
Bour et al.

(10) Patent No.: US 7,851,242 B2
(45) Date of Patent: Dec. 14, 2010

(54) MONOLITHIC WHITE AND FULL-COLOR LIGHT EMITTING DIODES USING OPTICALLY PUMPED MULTIPLE QUANTUM WELLS

(75) Inventors: David P. Bour, Cupertino, CA (US); Christopher L. Chua, San Jose, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 55 days.

(21) Appl. No.: 12/337,572

(22) Filed: Dec. 17, 2008

(65) Prior Publication Data

US 2010/0148146 A1 Jun. 17, 2010

(51) Int. Cl.
*H01L 21/00* (2006.01)

(52) U.S. Cl. .................. 438/35; 257/14; 257/E21.404; 257/E33.008

(58) Field of Classification Search ............... 257/13, 257/14, 21, 82, E29.069, E31.008, E21.404; 438/35, 47, 69, 956; 359/332
See application file for complete search history.

(56) References Cited

U.S. PATENT DOCUMENTS 5,434,700 A * 7/1995 Yoo ........................... 359/332

OTHER PUBLICATIONS

T. Azuhata, et al., "InGaN-Based Single-Chip Multicolor Light-Emitting Diodes", Jpn. J. Appl. Phys., vol. 42, pp. 497-498, 2003.
M. Yamada, et al., "A Methodological Study of the Best Solution for Generating White Light Using Nitride-Based Light Emitting Diodes", IEICE Trans. Electron., vol. E88-C, No. 9, pp. 1860-1871, Sep. 2005.
S.C. Shei, et al., "Emission Mechanism of Mixed-Color InGaN/GaN Multi-Quantum-Well Light-Emitting Diodes", Jpn. J. of Appl. Phys., vol. 45, No. 4A, pp. 2463-2466, 2006.
S.N. Lee, et al., "Monolithic InGaN-based White-Emitting Diodes with Blue, Green, and Amber Emissions", Appl. Phys. Letter, vol. 92, 081107, 2008.
I. Ozden, et al., "A Dual-Wavelength Indium Gallium Nitride Quantum Well Light Emitting Diode", Appl. Phys. Letter, vol. 79, No. 16, pp. 2532-2534, Oct. 2001.
T. Shioda, et al. "GaN Selective Area Metal-Organic Vapor Phase Epitaxy: Prediction of Growth Rate Enhancement by Vapor Phase Diffusion Model", Jpn. J. of Appl. Phys. vol. 46, No. 43, pp. L1045-L1047, 2007.

* cited by examiner

*Primary Examiner*—Quoc D Hoang
(74) *Attorney, Agent, or Firm*—Blakely Sokoloff Taylor & Zafman

(57) ABSTRACT

An embodiment is a method and apparatus for a white or full-color light-emitting diode. First single or multiple quantum wells (QWs) at a first wavelength are formed at an active region between a p-type layer and an n-type layer of a light-emitting diode. Multiple passive quantum wells (QWs) are formed within the p-type layer or the n-type layer. The multiple passive QWs are optically pumped by the first or single multiple QWs to generate a desired color.

25 Claims, 4 Drawing Sheets

US 7,851,242 B2

MONOLITHIC WHITE AND FULL-COLOR LIGHT EMITTING DIODES USING OPTICALLY PUMPED MULTIPLE QUANTUM WELLS

TECHNICAL FIELD

The presently disclosed embodiments are directed to the field of optics, and more specifically, to light-emitting diodes.

BACKGROUND

There has been considerable effort devoted toward development of nitride semiconductor light-emitting diodes (LEDs) for efficient solid-state lighting (SSL) and for full-color displays.

In the case of SSL, white light is generated by a blue LED through phosphor conversion of blue light into yellow; and this combination of blue and yellow appears white. Accordingly, the LED package typically includes a phosphor element which absorbs some of the blue emission from the nitride LED, and re-emits at yellow wavelengths. In order for the white emission to appear uniform over all viewing angles, the phosphor is distributed very uniformly. Inkjet printing and spin-on deposition technologies have been developed for phosphor application. Likewise, direct generation (phosphor-free) of white light has been demonstrated for chirped-quantum-well (QW) structures, for which the LED active region contains several QWs of different composition and thickness, each designed to emit at a wavelength whose combination appears white. Similarly, the multiple emission wavelengths may be accomplished by stacking two LED structures and placing a tunnel junction between them.

SUMMARY

One disclosed feature of the embodiments is a method and apparatus for a white or full-color light-emitting diode. First single or multiple quantum wells (QWs) at a first wavelength are formed in an active region between a p-type layer and an n-type layer of a light-emitting diode. Multiple passive quantum wells (QWs) are formed within the p-type layer or the n-type layer. The multiple passive QWs are optically pumped by the first single or multiple QWs to generate a desired color.

One disclosed feature of the embodiments is a white or full-color light-emitting diode. An n-type layer is deposited on the substrate. An active region having first single or multiple quantum wells (QWs) at a first wavelength is formed on the n-type layer. A first p-type layer is deposited on the active region. A second p-type layer is deposited on the first p-type layer. Multiple passive quantum wells (QWs) are formed at the p-type layer or the n-type layer. The multiple passive QWs are optically pumped by the first single or multiple QWs to generate a desired color.

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
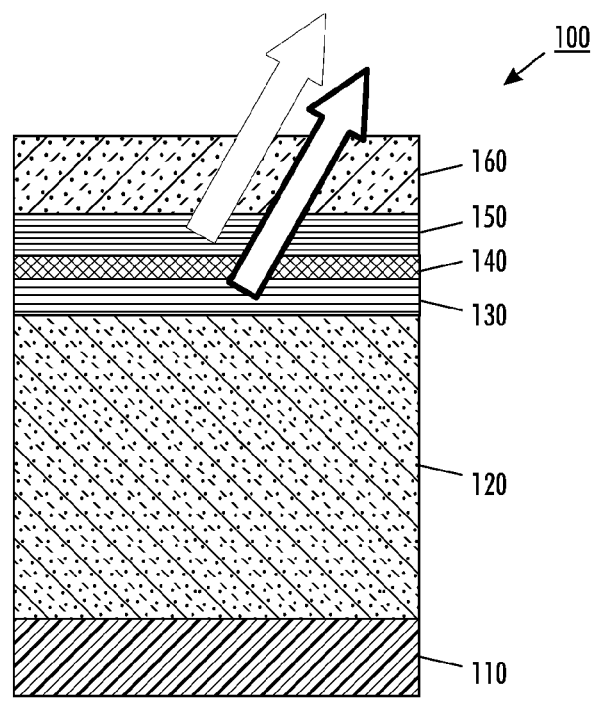
FIG. 1 is a diagram illustrating a monolithic LED structure having multiple passive QWs within the p-type layer according to one embodiment.

One disclosed feature of the embodiments is a method and apparatus for a white or full-color light-emitting diode. First single or multiple quantum wells (QWs) at a first wavelength are formed at an active region between a p-type layer and an n-type layer of a light-emitting diode. Multiple passive quantum wells (QWs) are formed within the p-type layer or the n-type layer. The multiple passive QWs are optically pumped by the first single or multiple QWs to generate a desired color.

One disclosed feature of the embodiments is a white or full-color light-emitting diode. An n-type layer is deposited on the substrate. An active region having first single or multiple quantum wells (QWs) at a first wavelength is formed on the n-type layer. A first p-type layer is deposited on the active region. A second p-type layer is deposited on the first p-type layer. Multiple passive quantum wells (QWs) are within the second p-type layer or the n-type layer. The multiple passive QWs are optically pumped by the first single or multiple QWs to generate a desired color.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus to fabricate a monolithic LED to generate a white light or a full-color light. The technique uses multiple QWs within either the p-type layer or n-type layer or both to generate a desired color. First single or multiple QWs at a first wavelength may be constructed to form an active region at the pn junction formed at the interface between the p-type and n-type layers. In one embodiment, the first wavelength may correspond to a range from 400 nanometer (nm) to 480 nm. In one embodiment, the first wavelength corresponds to a violet-emitting or a blue-emitting color. For a white color light, second multiple passive QWs at a second wavelength may be formed on either side of the first single or multiple QWs to be optically pumped by the first single or multiple QWs. In one embodiment, the second wavelength may correspond to a range including a yellow-emitting color. For a full-color light, third and fourth multiple passive QWs at third and fourth wavelengths may be formed on the same side or opposite sides of the first single or multiple QWs to be optically pumped by the first single or multiple QWs. In one embodiment, the third and fourth wavelengths may correspond to ranges including red-emitting and green-emitting colors, respectively. In the following description, for illustrative purposes, the description may refer to blue-emitting, yellow-emitting, red-emitting, or green-emitting. However, it is understood that the blue-emitting, yellow-emitting, red-emitting, or green-emitting correspond to first, second, third, and fourth wavelengths. In one embodiment, the first, second, third, and fourth wavelengths are different, corresponding to different colors. In general, within the device the radiation from the first active single or multiple QWs may be absorbed selectively by the passive multiple QWs. In the case where different types of passive quantum wells are placed on the same side of the first (e.g., blue-emitting) single or multiple QWs, it is preferable to arrange the passive QWs so lower bandgap QWs are placed progressively farther away from the active region. This arrangement allows optical pump light to reach the different types of passive QWs. The desired color output and color quality may be determined by the parameters of the passive QWs. The parameters that define the multiple passive QWs may be determined empirically to achieve the desired color. These parameters may include material composition, thickness (of QWs and buffer layers), number of QWs, and doping concentration/level, etc. In one embodiment, the thickness of the QWs may be approximately 3 nm. For such thickness, the single-pass absorption may be approximately 1%. The number of QWs may be greater or equal to 10, thereby constituting a super-lattice structure. In addition, the passive multiple QWs may operate in the low-injection regime, which is beneficial for InGaN QWs because the condition offers superior radiative efficiency.

The choice of forming the passive QWs on the n-side or p-side may also be determined empirically. It is noted that the placement of the QWs in the heavily doped cladding layers may be beneficial with regard to screening of the internal piezoelectric (PZ) fields. The doping may introduces charge carriers into the QWs, which screen the PZ field, leading to improved efficiency and enhanced spectral stability.

Embodiments may also include broadband QWs configuration having a wide variety of colors whose superposition produces a blackbody-like radiation spectrum. This may include an additional set of QWs, or additional sets of QWs, to produce some intermediate colors. In one embodiment, each QW may be slightly different from all the others.

The technique offers the benefit of eliminating phosphor and its associated deposition processes. Compared to chirped-active-region LEDs, the emission spectrum provided by the technique may be more stable with respect to drive-current variations because the relative QW populations change with current in a chirped-active-region QW device. Moreover, by engineering the parameters (e.g., composition, thickness, number, doping), the technique provides a true broadband, white emission spectrum with various emission wavelengths spanning the visible spectrum. The QW thickness and/or composition may be stepped or graded to produce a broadband emission.

FIG. 1 is a diagram illustrating a monolithic LED structure 100 having multiple passive QWs within the p-type layer according to one embodiment. The LED structure 100 includes a substrate 110, an n-type layer 120, an active region 130 having first single or multiple QWs, a first p-type layer 140, multiple passive QWs 150, and second, or upper, p-type layer 160. The LED structure 100 may include more or less than the above components.

The substrate 110 may be any suitable substrate. It may be made of sapphire ($Al_2O_3$), zinc oxide (ZnO), or silicon carbide (SiC). Typically, the substrate 110 has low lattice mismatch constant (e.g., approximately 3% to 14%) and is transparent to visible light.

The n-type layer 120 is deposited on the substrate 110. It is used together with the first and second p-type layers 140 and 160 to form the p-n junction for the diode operation in the LED. The n-type layer 120 may be made of suitable material. In one embodiment, it is made of gallium nitride (GaN) doped with Silicon. It may be deposited on the substrate 110 by a suitable deposition method such as the metal organic chemical vapor deposition (MOCVD). The thickness of the n-type layer 120 may be above the critical thickness (e.g., 2 µm) to reduce strain and defects at the interface with the substrate.

The active region 130 is between the n-type layer 120 and the first p-type layer 140. It has the first single or multiple QWs at a first wavelength formed on the n-type layer. In one embodiment, the first wavelength may range from 400 nm to 480 nm, including a blue-emitting wavelength. In one embodiment, the blue-emitting QWs may include alternating layers of a number of undoped $In_xGa_{1-x}N$ QWs with appropriate composition (e.g., $In_{0.15}Ga_{0.85}N$) and silicon doped $In_{0.02}Ga_{0.98}N$ or GaN barriers. The blue-emitting $In_xGa_{1-x}N$ QWs may have an appropriate thickness (e.g., 2 to 3 nm). The GaN barrier layer may have an appropriate thickness (e.g., 5 to 15 nm).

The first p-type layer 140 is deposited on the active region 130. It may serve to block the free carriers and to confine them within the active region 130. In one embodiment, it is made of $Al_yGa_{1-y}N$ doped with Magnesium (Mg) with an appropriate composition (e.g., y=0.2).

The second p-type layer 160 is deposited on the first p-type layer 140. It may be made of GaN doped with Magnesium (Mg). It may be activated with rapid thermal annealing (RTA) for removal of hydrogen atoms.

The multiple passive QWs 150 may be passive, i.e., not actively pumped by injection across the p-n junction. Rather, they may lie away from the active region 130 and may be formed within the second p-type layer 160. They are optically pumped by absorption of the first light (e.g., blue light) emitted by the first single or multiple QWs in the active region 130 to generate a desired color. The multiple passive QWs 150 may be of any appropriate color emission. In one embodiment, the multiple passive QWs 150 are second multiple QWs at a second wavelength and the desired color is white. In one embodiment, the second wavelength may correspond to range including a yellow-emitting color.

As discussed above, the parameters of the multiple passive QWs 150, such as the composition, thickness, number, and doping, may be selected to produce the desired color with desired intensity and quality.

Figure 2:
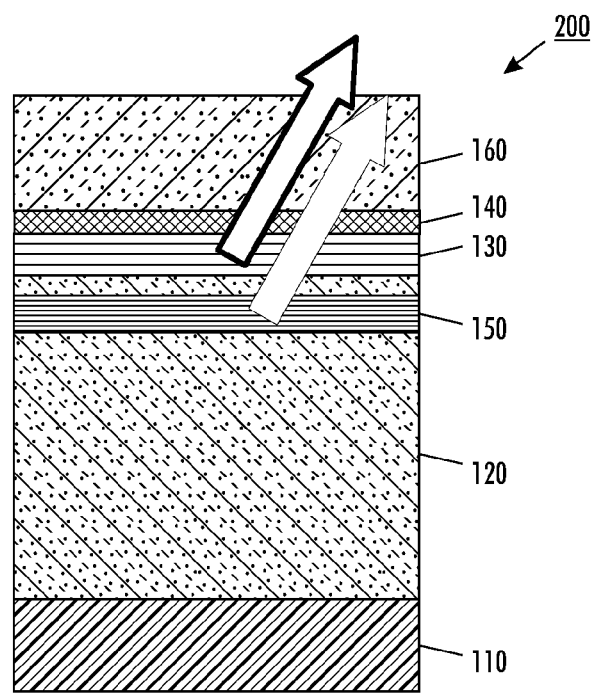
FIG. 2 is a diagram illustrating a monolithic LED structure having multiple passive QWs within the n-type layer according to one embodiment.

FIG. 2 is a diagram illustrating a monolithic LED structure 200 having multiple passive QWs within the n-type layer according to one embodiment. The LED structure 200 is similar to the LED structure 100 shown in FIG. 1 except that the multiple passive QWs 150 are formed within the n-type layer 120.

As in the LED structure 100, the multiple passive QWs 150 of the LED structure 200 are optically pumped by absorption of the first light (e.g., blue light) emitted by the first single or multiple (e.g., blue-emitting) QWs in the active region 130 to generate a desired color. In one embodiment, the multiple passive QWs 150 are second multiple QWs at a second wavelength and the desired color is white. In one embodiment, the second wavelength corresponds to a range including yellow-emitting color.

Figure 3:
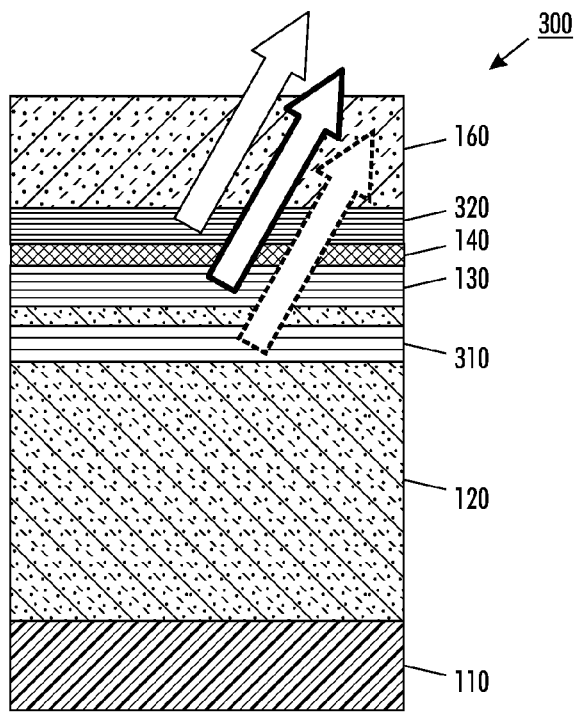
FIG. 3 is a diagram illustrating a monolithic LED structure having passive QWs of a first type and of a second type on opposite sides of first single or multiple QWs to generate full-color light according to one embodiment.

FIG. 3 is a diagram illustrating a monolithic LED structure 300 having multiple passive QWs of a first type and of a second type on opposite sides of the first single or multiple QWs to generate full-color light according to one embodiment. The LED structure 300 includes the substrate 110, the n-type layer 120, multiple passive QWs of a first type 310, multiple passive QWs of a second type 320, the active region 130 having the first single or multiple QWs, the first p-type layer 140, and the second p-type layer 160. The LED structure 100 may include more or less than the above components.

The substrate 110, the n-type layer 120, the active region 130 having the first single or multiple QWs, the first p-type layer 140, and the second p-type layer 160 are similar to the same components shown in FIG. 1.

The multiple passive QWs of the first type 310 and of the second types 320 may be on opposite sides of the active region 130 having the first single or multiple (e.g., blue-emitting) QWs. In one embodiment, the multiple passive QWs of the first type 310 correspond to third multiple QWs at a third wavelength and may be formed within the n-type layer 120 and the multiple passive QWs of the second type 320 correspond to fourth multiple QWs at a fourth wavelength and may be formed within the second p-type layer 160. They are optically pumped by absorption of the first light (e.g., blue light) emitted by the electrically injected first single or multiple QWs in the active region 130 to generate a desired color. The multiple passive QWs of the first type 310 and of the second types 320 may be of any appropriate color emission. In one embodiment, the multiple passive QWs of the first type 310 may be green-emitting QWs and the multiple passive QWs of the second type 320 may be red-emitting QWs. In another embodiment, the multiple passive QWs of the first type 310 may be red-emitting QWs and the multiple passive QWs of the second type 320 may be green-emitting QWs.

As discussed above, their parameters may be selected or determined empirically to provide the desired color and color quality. By selecting appropriate parameters of the passive QWs 310 and 320, a full color light output may be achieved. A full-color refers to a true color that may be any color within the visible spectrum.

Figure 4:
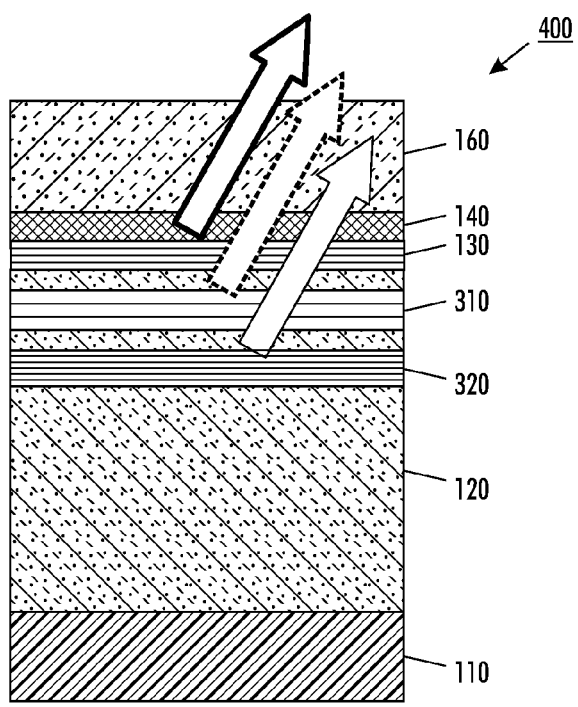
FIG. 4 is a diagram illustrating a monolithic LED structure having multiple passive QWs of a first type and of a second type on the same side of first single or multiple QWs to generate full-color light according to one embodiment.

FIG. 4 is a diagram illustrating a monolithic LED structure 400 having multiple passive QWs of a first type and of a second type on the same side of the first single or multiple (e.g., blue-emitting) QWs to generate full-color light according to one embodiment. The LED structure 400 includes the substrate 110, the n-type layer 120, multiple passive QWs of a first type 310, multiple passive QWs of a second type 320, the active region 130 having the first single or multiple QWs, the first p-type layer 140, and the second p-type layer 160. The LED structure 100 may include more or less than the above components.

The substrate 110, the n-type layer 120, the active region 130 having first single or multiple QWs, the first p-type layer 140, and the second p-type layer 160 are similar to the same components shown in FIG. 1.

The multiple passive QWs of the first type 310 and of the second type 320 may be on the same side of the active region 130 having the first single or multiple QWs. In one embodiment, the multiple passive QWs of the first type 310 and the second type 320 may be formed within the n-type layer 120. In another embodiment, the multiple passive QWs of the first type 310 and the second type 320 may be formed within the second p-type layer 160. They are optically pumped by absorption of the first light (e.g., blue light) emitted by the first single or multiple QWs in the active region 130 to generate a desired color. The multiple passive QWs of the first type 310 and of the second type 320 may be of any appropriate color emission. In one embodiment, the multiple passive QWs of the first type 310 may be green-emitting QWs and the multiple passive QWs of the second type 320 may be red-emitting QWs. In another embodiment, the multiple passive QWs of the first type 310 may be red-emitting QWs and the multiple passive QWs of the second type 320 may be green-emitting QWs. Alternatively, the QW parameters may be varied continuously (e.g., chirped) in order to obtain a true white emission (e.g., broadband radiation spectrum like that of a black body).

As discussed above, their parameters may be selected or determined empirically to provide the desired color and color quality. By selecting appropriate parameters of the passive QWs 310 and 320, a full color light output may be achieved. A full-color refers to a true color that may be any color within the visible spectrum.

Figure 5:
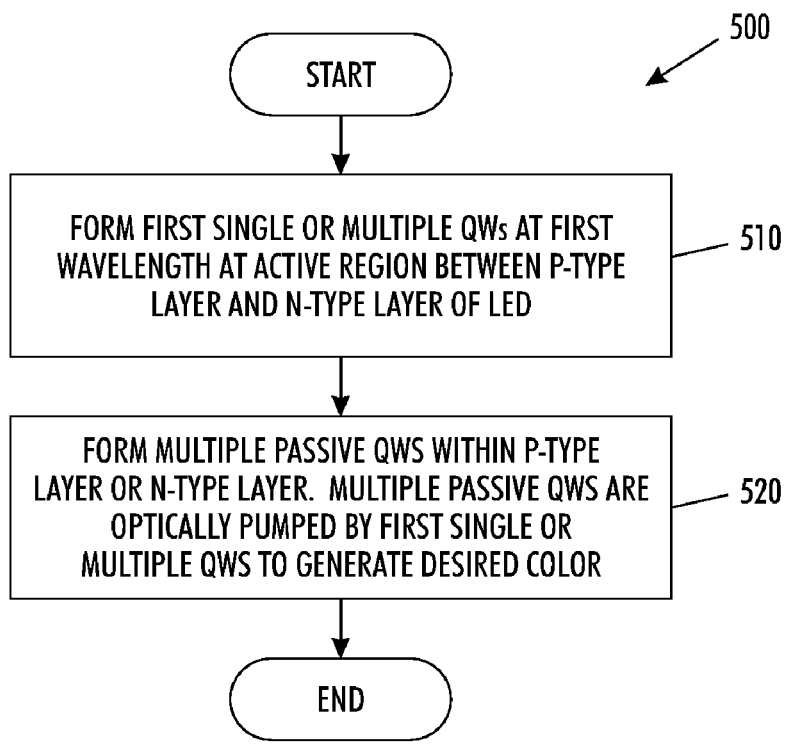
FIG. 5 is a flowchart illustrating a process to fabricate a monolithic LED to generate a desired color according to one embodiment.

FIG. 5 is a flowchart illustrating a process 500 to fabricate a monolithic LED to generate a desired color according to one embodiment.

Upon START, the process 500 forms first single or multiple QWs at a first wavelength at an active region between a p-type layer and an n-type layer of a light-emitting diode (Block 510). In one embodiment, the first wavelength may correspond to a range of 400 nm to 480 nm, including blue-emitting color.

Next, the process 500 forms multiple passive QWs within the p-type layer or the n-type layer (Block 520). The multiple passive QWs are optically pumped by the first single or multiple QWs to generate a desired color. The process 500 is then terminated.

Figure 6:
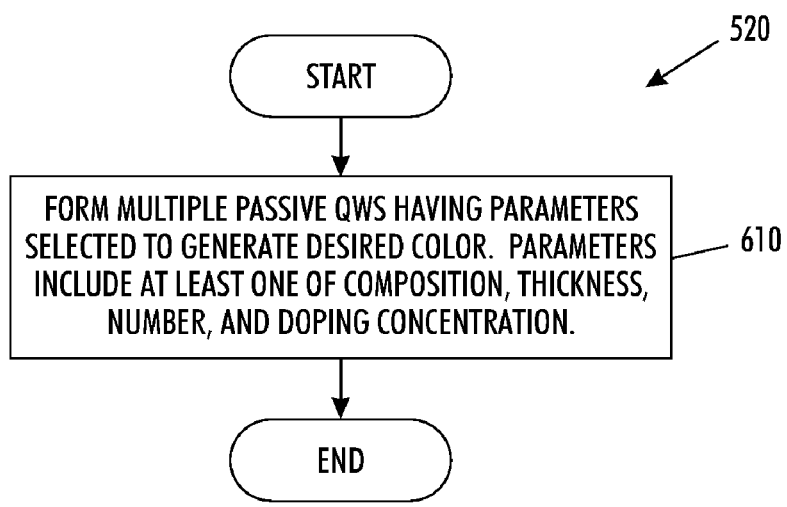
FIG. 6 is a flowchart illustrating a process to form multiple passive QWs within p-type layer or n-type layer according to one embodiment.

FIG. 6 is a flowchart illustrating the process 520 shown in FIG. 5 to form multiple passive QWs within the p-type layer or n-type layer according to one embodiment.

Upon START, the process 520 forms the multiple passive QWs having parameters selected to generate the desired color (Block 610). The parameters include at least one of composition, thickness, number, and doping concentration. In one embodiment, the number of the QWs is greater than or equal to 10. The process 520 is then terminated.

Figure 7:
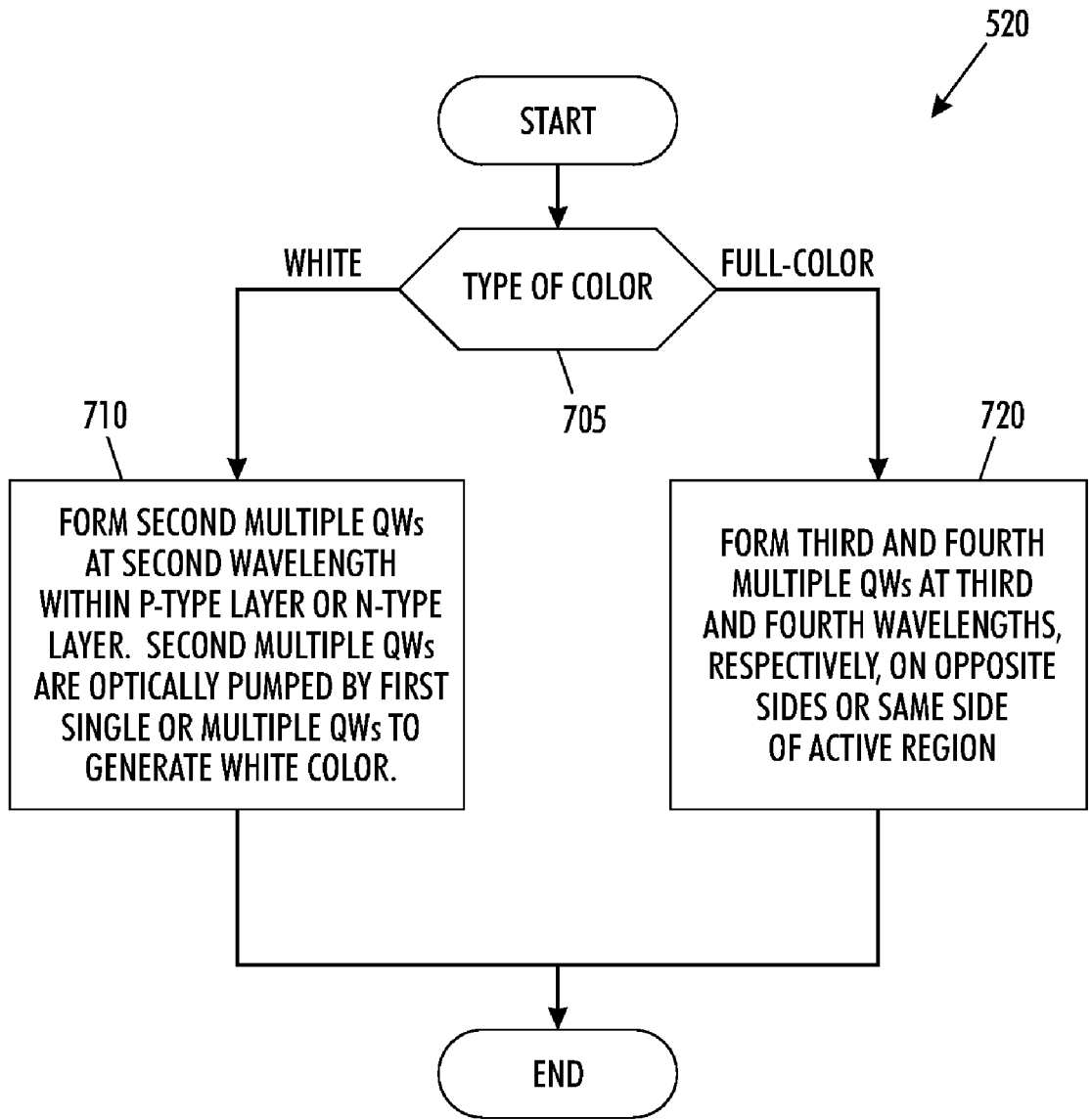
FIG. 7 is a flowchart illustrating a process to form multiple passive QWs within p-type layer or n-type layer to generate white light or full-color light according to one embodiment.

FIG. 7 is a flowchart illustrating the process 520 shown in FIG. 5 to form multiple passive QWs within the p-type layer or n-type layer to generate white light or full-color light according to one embodiment.

Upon START, the process 520 determines the type of color (Block 705). If the type of color is white color, the process 520 forms second multiple QWs at a second wavelength within the p-type layer or the n-type layer (Block 710). The second multiple QWs are optically pumped by the electrically injected first single or multiple QWs to generate the white color. In one embodiment, the second wavelength corresponds to a range including yellow-emitting color. The process 520 is then terminated.

If the type of color is full color, the process 520 forms third and fourth multiple QWs on opposite sides or same side of the active region (Block 720). In one embodiment, the third multiple QWs are formed within the p-type layer and the fourth multiple QWs are formed within the n-type layer. In another embodiment, both the third and fourth multiple QWs are formed within the n-type layer and the fourth multiple QWs are closer to the first single or multiple QWs than the third multiple QWs. In other words, the fourth multiple QWs are between the first single or multiple QWs and the third multiple QWs. In one embodiment, the third and fourth wavelengths correspond to red-emitting and green-emitting colors, respectively. The process 520 is then terminated. Alternatively, the QW parameters may be varied continuously (e.g., chirped) in order to obtain a true white emission (e.g., broadband radiation spectrum like that of a black body).

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method comprising:
    forming first single or multiple quantum wells (QWs) at a first wavelength at an active region between a p-type layer and an n-type layer of a light-emitting diode; and
    forming multiple passive quantum wells (QWs) within the p-type layer or the n-type layer, the multiple passive QWs being optically pumped by the first single or multiple QWs to generate a desired color.

2. The method of claim 1 wherein forming multiple passive QWs comprises:
    forming the multiple passive QWs having parameters selected to generate the desired color.

3. The method of claim 2 wherein the parameters include at least one of composition, thickness, number, and doping concentration.

4. The method of claim 1 wherein the first wavelength corresponds to a range from 400 nm to 480 nm.

5. The method of claim 1 wherein forming the multiple passive QWs comprises:
    forming second multiple QWs at a second wavelength within the p-type layer or the n-type layer, the second multiple QWs being optically pumped by the first single or multiple QWs to generate a white color.

6. The method of claim 1 wherein forming the multiple passive QWs comprises:
    forming third multiple QWs at a third wavelength and fourth multiple QWs at a fourth wavelength on opposite sides of the active region.

7. The method of claim 6 wherein forming the third and fourth multiple QWs comprises:
    forming the third multiple QWs within the p-type layer; and
    forming the fourth multiple QWs within the n-type layer.

8. The method of claim 6 wherein forming the third and fourth multiple QWs comprises:
    forming the third multiple QWs within the n-type layer; and
    forming the fourth multiple QWs within the p-type layer.

9. The method of claim 1 wherein forming the multiple passive QWs comprises:
    forming third multiple QWs at a third wavelength and fourth multiple QWs at a fourth wavelength on same side of the active region, the same side being within the n-type layer or the p-type layer.

10. An apparatus comprising:
    first single or multiple quantum wells (QWs) at a first wavelength at an active region between an p-type layer and an n-type layer; and
    multiple passive quantum wells (QWs) within the p-type layer or the n-type layer, the multiple passive QWs being optically pumped by the first single or multiple QWs to generate a desired color.

11. The apparatus of claim 10 wherein the multiple passive QWs have parameters selected to generate the desired color.

12. The apparatus of claim 11 wherein the parameters include at least one of composition, thickness, number, and doping concentration.

13. The apparatus of claim 10 wherein the first wavelength corresponds to a range from 400 nm to 480 nm.

14. The apparatus of claim 10 wherein the multiple passive QWs comprise:
    second multiple QWs at a second wavelength within the p-type layer or the n-type layer, the second multiple QWs being optically pumped by the first single or multiple QWs to generate a white color.

15. The apparatus of claim 10 wherein the multiple passive QWs comprises:
    third multiple QWs at a third wavelength and fourth multiple QWs at a fourth wavelength on opposite sides of the active region.

16. The apparatus of claim 15 wherein the third and fourth multiple QWs comprises:
    the third multiple QWs within the p-type layer; and
    the fourth multiple QWs within the n-type layer.

17. The apparatus of claim 15 wherein the third and fourth multiple QWs comprise:
    the third multiple QWs within the n-type layer; and
    the fourth multiple QWs within the p-type layer.

18. The apparatus of claim 10 wherein the multiple passive QWs comprise:
    third multiple QWs at a third wavelength and fourth multiple QWs at a fourth wavelength on same side of the active region, the same side being at the n-type layer or the p-type layer.

19. A light-emitting diode (LED) comprising:
    a substrate;
    an n-type layer deposited on the substrate;
    an active region having first single or multiple quantum wells (QWs) at a first wavelength formed on the n-type layer;
    a first p-type layer deposited on the active region;
    a second p-type layer deposited on the first p-type layer; and
    multiple passive quantum wells (QWs) formed within the p-type layer or the n-type layer, the multiple passive QWs being optically pumped by the first single or multiple QWs to generate a desired color.

20. The LED of claim 19 wherein the multiple passive QWs have parameters selected to generate the desired color.

21. The LED of claim 20 wherein the parameters include at least one of composition, thickness, number, and doping concentration.

22. The LED of claim 19 wherein the first wavelength corresponds to a range from 400 nm to 480 nm.

23. The LED of claim 19 wherein the multiple passive QWs comprise:
    second multiple QWs within the p-type layer or the n-type layer, the second multiple QWs being optically pumped by the first single or multiple QWs to generate a white color.

24. The LED of claim 19 wherein the multiple passive QWs comprise:
    third multiple QWs at a third wavelength and fourth multiple QWs at a fourth wavelength on opposite sides of the active region.

25. The LED of claim 19 wherein the multiple passive QWs comprise:
    third multiple QWs at a third wavelength and fourth multiple QWs at a fourth wavelength on same side of the active region, the same side being within the n-type layer or the p-type layer.

* * * * *